(12) United States Patent
Feldman et al.

(10) Patent No.: US 7,616,012 B2
(45) Date of Patent: Nov. 10, 2009

(54) SYSTEMS, METHODS, AND APPARATUS FOR MEASURING CAPACITANCE IN A STATOR COMPONENT

(75) Inventors: Brian David Feldman, Macungie, PA (US); Roderick Mark Lusted, Niskayuna, NY (US); Brock M. Lape, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 101 days.

(21) Appl. No.: 11/747,715

(22) Filed: May 11, 2007

(65) Prior Publication Data

US 2008/0278180 A1     Nov. 13, 2008

(51) Int. Cl.
  *G01R 27/28*  (2006.01)
  *G01R 19/00*  (2006.01)
(52) U.S. Cl. ............... 324/686; 324/658; 324/690; 324/67
(58) Field of Classification Search ......... 324/658–690, 324/67
  See application file for complete search history.

(56) References Cited

U.S. PATENT DOCUMENTS

| | | | |
|---|---|---|---|
| 4,482,860 A | 11/1984 | Risko | |
| 6,225,813 B1 | 5/2001 | Garwatoski | |
| 7,212,015 B2* | 5/2007 | Kitaoka | 324/662 |
| 7,368,921 B2* | 5/2008 | Deangelis et al. | 324/661 |
| 2003/0222662 A1 | 12/2003 | Geisel | |
| 2006/0070227 A1 | 4/2006 | Clough et al. | |

FOREIGN PATENT DOCUMENTS

| | | |
|---|---|---|
| EP | 0794437 A | 9/1997 |
| EP | 1703293 A | 9/2006 |
| JP | 2001359257 A | 12/2001 |

OTHER PUBLICATIONS

Inoue, Y., Technology for Detecting Wet Bars in Water-Cooled Stator Windings of Turbine Generators, Electric Machines and Drives Conference, 2003, IEEE International, Jun. 1-4, 2003, Piscataway, NJ, vol. 2, pp. 1337-1343.
European Search Report for EP08155856.1 dated Aug. 28, 2008.

* cited by examiner

*Primary Examiner*—Timothy J Dole
*Assistant Examiner*—Farhana Hoque
(74) *Attorney, Agent, or Firm*—Sutherland Asbill & Brennan LLP

(57) ABSTRACT

Embodiments of the invention can provide systems, methods, and apparatus for providing a capacitance paddle for measuring capacitance in a stator component such as a stator bar. In one embodiment, a system for measuring capacitance can include an output device operable to measure capacitance in an object. Furthermore, the system can include at least three contacts operable to mount to the object to be sensed. In addition, the system can include at least one conductive material operable to mount to the object to be sensed. Moreover, the system can include a compressible material adjacent to at least some of the at least three contacts and the at least one conductive material, wherein the compressible material can be compressed to permit the contacts to simultaneously contact the object to be sensed, and wherein the output device can output a measure of capacitance associated with the object.

19 Claims, 2 Drawing Sheets

SYSTEMS, METHODS, AND APPARATUS FOR MEASURING CAPACITANCE IN A STATOR COMPONENT

FIELD OF THE INVENTION

The invention relates to electrical power generators, and more particularly, to systems, methods, and apparatus for measuring capacitance in a stator component such as a stator bar of an electrical power generator

BACKGROUND OF THE INVENTION

In large industrial or utility motors and generators, the stator windings, also known as armature windings, can include a series of stator windings. Each stator winding can include a series of conductive or stator bars wrapped in one or more layers of insulation. The insulation can confine the current in the stator bars, and can prevent the arcing of electrical current between windings. Furthermore, the insulation can shield the stator bars against stray objects that could electrically short the bars. If the insulating properties of the insulation degrades over time or becomes damp due to excess moisture from a cooling leak, voltage arcs may jump from the stator bars through degraded regions of the insulation and cause electrical shorts that may harm people and/or equipment. Early detection of such leaks can minimize or prevent harm to people and/or equipment.

Various maps of the stator windings, in particular, the stator bar insulation, can be created to track and monitor different physical characteristics, such as temperature or other physical characteristics. These maps can assist an operator or testing personnel in identifying failures or defects in the stator windings or stator bars. As described above, the failure to detect moisture in the stator windings and stator bards can lead to dangerous electrical shorts, such as "phase to ground faults" or "phase to phase faults".

One type of map that can be generated during a generator service inspection is a "capacitance map". A capacitance map can include a display of capacitance measurements of each of the stator bars. In this example, each capacitance measurement can be measured at two locations along the stator bar, with one measurement at each end of the generator. Typically, statistical analysis of the collected data can be conducted during or after data collection to filter outlier-type or false negative data based on a predetermined standard. However, data collection using conventional techniques and devices may be prone to error. Using a conventional probe to measure capacitance, the conventional probe can be mounted to a stator bar wherein the probe is in physical contact with the stator bar. In some instances, variations or imperfections in the surface area of the probe can cause noise in the capacitance measurements. In some other instances, gaps between the probe and the surface of the stator bar or insulated stator bar can cause noise in the capacitance measurements. In other instances, probe misalignment can cause noise in the capacitance measurements. In any instance, noise in the capacitance measurements can affect the quality of the collected data.

Thus, there is a need for improved stator monitoring systems and methods. There is also a need for systems, methods, and apparatus to collect capacitance data from a stator component. There is also a need for systems, methods, and apparatus for measuring capacitance in a stator component.

BRIEF DESCRIPTION OF THE INVENTION

Embodiments of the invention can address some or all of the needs described above. Embodiments of the invention are directed generally to systems, methods, and apparatus for measuring capacitance in a stator component such as a stator bar. According to one embodiment of the invention, a system for measuring capacitance can include an output device operable to measure capacitance in an object. Furthermore, the system can include at least three contacts, wherein the contacts can be simultaneously mounted to an object to be sensed. In addition, the system can include at least one conductive material operable to mount to the object to be sensed. Moreover, the system can include a compressible material adjacent to at least some of the at least three contacts and the at least one conductive material, wherein the compressible material can be compressed to permit the contacts to simultaneously contact the object to be sensed, and wherein the output device can output a measure of capacitance associated with the object.

According to an embodiment of the embodiment, a method for measuring capacitance can include providing a capacitance measuring device. Providing a capacitance measuring device can comprise providing a device comprising an output device operable to output an indication associated with capacitance of an object. In addition, providing a capacitance measuring device can comprise providing a device comprising at least three contacts operable to mount to an object to be sensed. Furthermore, providing a capacitance measuring device can comprise providing a device comprising at least one conductive material operable to mount to the object to be sensed. Moreover, providing a capacitance measuring device can comprise providing a device comprising a compressible material disposed adjacent to at least some of the at least three contacts and the at least one conductive material, wherein the compressible material can be compressed to permit at least some of the contacts to simultaneously contact the object. The method can also include positioning the capacitance measuring device adjacent the object. In addition, the method can include compressing the compressible material against the object, wherein at least some of the contacts simultaneously contact the object, and observing an output from the output device, wherein the output is associated with the capacitance of the object.

According to another embodiment of the invention, a system for measuring capacitance is provided. The system can include at least one output device operable to measure capacitance in an object to be sensed. Furthermore, the system can include a first paddle and a second paddle. Each paddle can include at least one contact, wherein the at least one contact is in communication with the at least one output device. Each paddle can also include a conductive material operable to mount to the object to be sensed. In addition, each paddle can include a compressible material adjacent to the at least one contact and the conductive material, wherein the compressible material can be compressed to permit the at least one contact to contact the object to be sensed, wherein the output device can output a measure of capacitance associated with at least one capacitance component associated with each paddle.

Other embodiments and aspects of the invention will become apparent from the following description taken in conjunction with the following drawings.

BRIEF DESCRIPTION OF THE DRAWINGS

Figure 1:
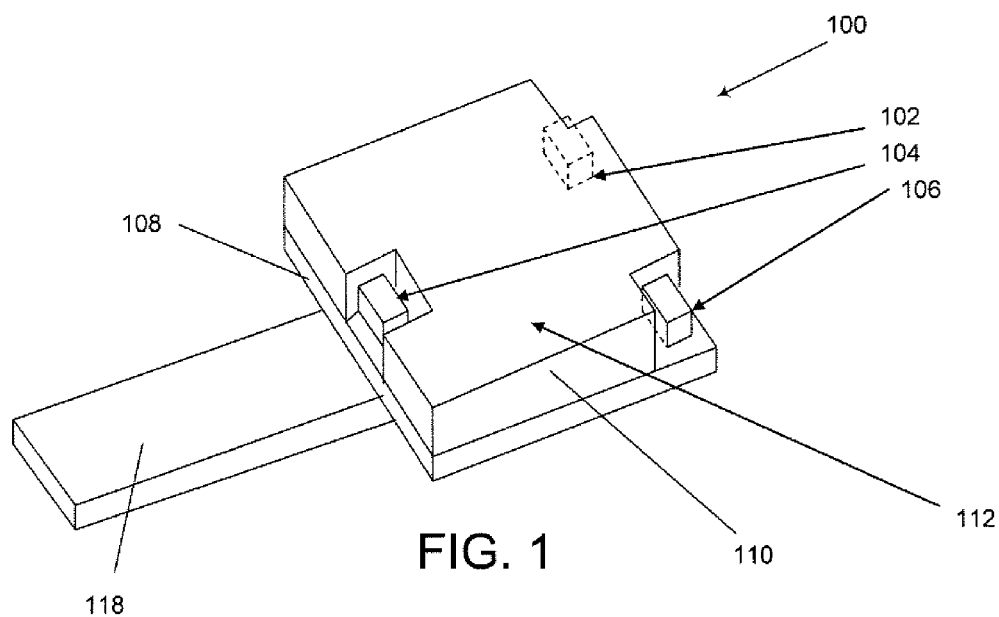

Having thus described the invention in general terms, reference will now be made to the accompanying drawings, which are not necessarily drawn to scale, and wherein:

FIG. 1 is perspective view of an example system and apparatus for a capacitance measuring device according to an embodiment of the invention.

Figure 2:
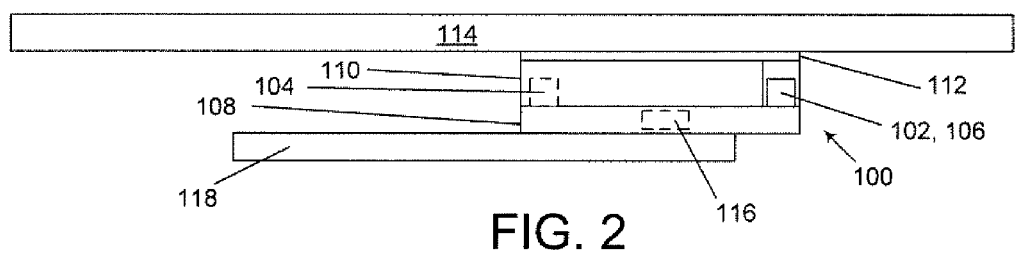

FIG. 2 is a side view of the example system and apparatus shown in FIG. 1 with the apparatus mounted to an example stator component, such as a stator bar.

Figure 3:
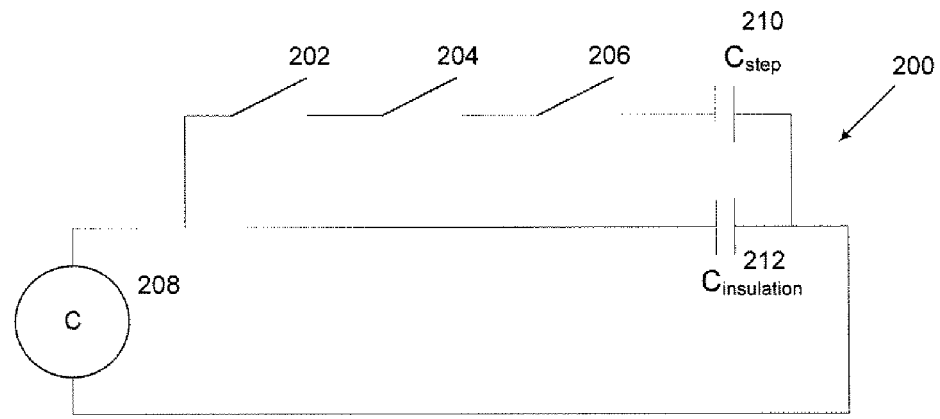

FIG. 3 is a circuit diagram of an example system and apparatus according to an embodiment of the invention.

Figure 4:
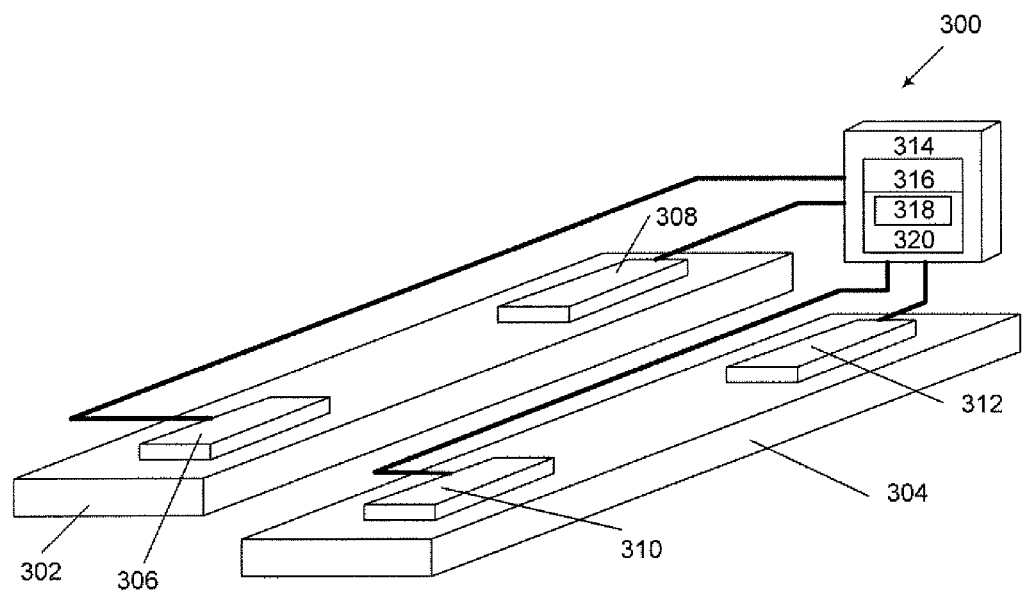

FIG. 4 is a diagram illustrating an example series of system and apparatus for a capacitance measuring device according to one embodiment of the invention.

DETAILED DESCRIPTION OF THE INVENTION

Some or all of the embodiments of the invention can provide some or all of the following aspects: (1) Improved capacitance measurements and data; (2) lower moisture detection thresholds for generator capacitance maps, thus facilitating early detection of leaking stator bars; (3) relatively faster cycle times for testing and analysis; (4) relatively lower equipment costs for inspections and testing; and (5) relatively lower maintenance costs for inspection and testing equipment.

The invention now will be described more fully hereinafter with reference to the accompanying drawings, in which example embodiments of the invention are shown. This invention may, however, be embodied in many different forms and should not be construed as limited to the example embodiments set forth herein; rather, these embodiments are provided so that this disclosure will convey the scope of the invention to those skilled in the art. Like numbers refer to like elements throughout.

Embodiments of the invention, such as the example system and apparatus 100 shown in FIGS. 1 and 2, and the example system 200 shown in FIG. 3, can be implemented with a power generator with one or more stator components or stator bars. It will be understood by those skilled in the art that the embodiments described herein may be applicable to a variety of systems, devices, and environments, and are not limited to generators, liquid cooled generators, stator components, stator bars, insulated stator bars, or other devices similar to those described in the context of FIGS. 1-4.

The example system and apparatus 100 of FIGS. 1 and 2 is a paddle-type device operable for measuring capacitance in an object, such as a stator component or stator bar. When the example system and apparatus 100 is in communication with an output device, such as a capacitance meter or multimeter, a capacitance measurement for an object can be obtained. FIG. 1 is a perspective view of the example system and apparatus 100, and FIG. 2 illustrates a side view of the system and apparatus 100 in FIG. 1 mounted to a stator component, such as a stator bar. In the example shown, a system and apparatus 100 can include a series of contacts 102, 104, 106, a mounting device 108, at least one compressible material 110, and a conductive material 112. In other embodiments, some or all of the above components can be used in accordance with the invention. The example system and apparatus 100 of FIGS. 1 and 2 can be mounted to an object to be sensed, such as a stator component or stator bar 114 shown in FIG. 2. In other embodiments, the system and apparatus 100 can be mounted to other devices in a variety of environments where capacitance measurements are desired.

In the embodiment shown, the contacts 102, 104, 106 can be, for example, a series of pressure switches capable of being closed when a predefined amount of force or pressure is applied to each switch. In another embodiment, the contacts 102, 104, 106 can be a series of pressure sensors mounted on respective blocks, wherein the respective blocks can mount between the sensors and the mounting device 108, and the sensors are capable of being activated when a predefined amount of force or pressure is applied to each sensor. In yet another embodiment, the contacts 102, 104, 106 can be a series of blocks for mounting between the mounting device 108 and the object to be sensed. In any instance, the contacts 102, 104, 106 are operable to mount to an object to be sensed, such as a stator bar similar to that shown as 114 in FIG. 2, and when actuated or activated, the contacts 102, 104, 106 can form a closed loop electrical circuit. In one embodiment, the object to be sensed can be an insulated stator bar. In the embodiment where the contacts 102, 104, 106 are blocks, the simultaneous contact of the blocks 102, 104, 106 with the object to be sensed can form a similar closed loop electrical circuit. In any instance, the contacts 102, 104, 106 are operable to communicate with an output device, such as a 208 in FIG. 3.

An example electrical circuit 200 with switches 202, 204, 206 is shown in FIG. 3. The switches 202, 204, 206 are shown by way of example to demonstrate that the respective contacts 102, 104, 106 can be simultaneously closed when all three contacts 102, 104, 106 are sufficiently close to the object to be sensed to form a closed circuit. In the example shown in FIGS. 1 and 2, the contacts 102, 104, 106 can be oriented in a triangular and co-planar arrangement. The contacts 102, 104, 106 can be electrically connected in series and can be closely associated with the mounting device 108. Other suitable contacts can include, but are not limited to, a conductive object, switches, microswitches, and sensors. In other embodiments, fewer or greater numbers of contacts can be used in an apparatus accordance with the invention. In yet other embodiments, the contacts can be arranged in other geometries and configurations.

In other embodiments, the contacts can be configured or arranged to measure a different electrical characteristic, such as a change in impedance, complex impedance, or other physical characteristic of an object. In these embodiments, changes in the impedance, complex impedance, or other physical characteristics can be used to determine whether a change in the condition of the object being sensed has occurred or is occurring.

Mounting device 108 can be a paddle-type device or other structure operable to be manually or otherwise physically mounted to an object to be sensed, such as a stator component or stator bar. To facilitate mounting and/or removal by a user or operator, the mounting device 108 may have an associated handle 118. The contacts 102, 104, 106 can each mount to one side of the mounting device 108, such that the contacts are in a triangular and co-planar orientation.

In one embodiment, a stepping capacitor 116 can be positioned with respect to or otherwise associated with the handle 118. For example, the stepping capacitor 116 can be in electrical communication with the contacts 102, 104, 106, and can be part of the electrical circuit. In some instances, the stepping capacitor 116 can provide a fixed capacitance reference or measure for the system and apparatus 100. In these instances, the fixed capacitance reference or measure can be a threshold, which may be exceeded when all of the contacts 102, 104, 106 are closed, or are sufficiently close to the object being sensed, to complete the associated closed electrical circuit.

In the embodiment shown in FIGS. 1 and 2, the compressible material 110 can mount to the same side of the mounting device 108 as the contacts 102, 104, 106. Generally, the compressible material 110 is selected to be a compliant-type material which can be compressed against the object to be sensed. In the example shown, when compressed, the compressible material 110 can minimize the amount of air between the object to be sensed and the system and apparatus 100. In one embodiment, the compressible material 110 can be oriented with respect to the mounting device 108, such that at least a portion of the compressible material 110 can be disposed between the mounting device 108 and the object to be sensed, such as a stator component or stator bar. As shown, the compressible material 110 can be uniquely shaped or otherwise formed to permit the contacts 102, 104, 106 to be adjacent to the compressible material 110, and yet permit the contacts 102, 104, 106 to mount directly to an object to be sensed. In other embodiments, a compressible material can be divided, split, or otherwise apportioned, and each respective portion of compressible material can be disposed between the mounting device 108 and the object to be sensed, such as a stator component or stator bar. Suitable compressible materials can include, but are not limited to, a foam, a gel, rubber, silicon gel, silicon rubber, an elastomer, a compliant material, or a spring.

In the example shown in FIGS. 1 and 2, the compressible material 110 can extend approximately 1 inch (2.2 cm) from the surface of the mounting device 108, and the contacts 102, 104, 106 can extend approximately 0.75 inches (1.65 cm) from the surface of the mounting device 108.

As shown in FIGS. 1 and 2, a conductive material 112 can be mounted to a portion of the compressible material 110. In this example, the conductive material 112 is relatively thin, and can be substantially disposed between the compressible material 110 and the object to be sensed, such as a stator component or stator bar 114. An example conductive material can include, but is not limited to, a foil, a metallic material, or a partially conductive material.

In one embodiment, the compressible material 110 and conductive material 112 can be combined or otherwise integrated. Integrated, for example, can be defined as joining or combining two materials such that the joined or combined materials still maintain at least a portion of the respective properties of the original disjoined or uncombined materials. For instance, a silicone rubber material and a silver component material can be utilized such that the integrated material is both compressible and conductive.

In the configuration shown in FIGS. 1 and 2, the combination of a compressible material 110 and conductive material 112 permits the mounting device 108 to be suitably mounted to an object to be sensed, such as a stator component or stator bar. In particular instances, in which the object to be sensed includes one or more irregularities in or on the surface upon which the mounting device 108 and contacts 102, 104, 106 are to be mounted, the use of the combination of a compressible material 110 and conductive material 112 can reduce the variations in pressure applied to the surface of the object to be sensed. In other instances, the amount of air between the object to be sensed and the system and apparatus 100 can be minimized to permit the contacts 102, 104, 106 to simultaneously contact the object to be sensed.

In one embodiment, the compressible material can be selected to compress a predetermined amount such that the contacts, for instance 102, 104, 106, can be manipulated to form a closed electrical circuit. In this manner, a user or operator of the system and apparatus 100 can consistently mount the system and apparatus 100 to an object to be sensed by applying a predetermined amount of pressure to the system and apparatus 100 such that the contacts 102, 104, 106 are also consistently and simultaneously mounted to the object.

In one embodiment, each contact 102, 104, 106 can include a mechanical stop positioned between the respective contact 102, 104, 106 and the mounting device 108. Together or individually, the mechanical stops can suitably position and orient the contacts 102, 104, 106 with respect to the compressible material 110 depending on the compression, recovery, and other physical characteristics of the contacts 102, 104, 106 and/or compressible material 110.

In another embodiment, each of the contacts 102, 104, 106 can be associated with a respective indicator, such as a LED or light. When each of the contacts 102, 104, 106 is actuated, activated, or otherwise receives a sufficient amount of force or pressure, each associated indicator can illuminate or otherwise indicate to a user that the respective contact is actuated, activated, or has otherwise received a sufficient amount of force or pressure. In yet another embodiment, a single indicator can be associated with all some or all of the contacts 102, 104, 106. When some or all of the contacts 102, 104, 106 are actuated, activated, or otherwise receive a sufficient amount of force or pressure, the associated indicator can illuminate or otherwise indicate to a user that the contacts are actuated, activated, or have otherwise received a sufficient amount of force or pressure.

The example system 200 in FIG. 3 includes an output device which can be implemented with the system and apparatus 100 shown in FIGS. 1 and 2. In accordance with one embodiment of the invention, the electrical schematic diagram in FIG. 2 illustrates a system operable for measuring capacitance in a stator component, such as a stator bar. The system 200 shown can include a series of switches or contacts 202, 204, 206; and an output device 208, such as a capacitance meter or multimeter.

Contacts 202, 204, 206 can be, for example, a series of pressure switches mounted on a stator component, such as a stator bar. In other embodiments, the contacts 202, 204, 206 can be similar to the contacts 102, 104, 106 described in FIGS. 1 and 2. Each of the contacts 202, 204, 206 can be operable to communicate with at least one output device, such as 208. In this example, the contacts 202, 204, 206 can be electrically connected in series to provide a closed electrical circuit with the output device 208 when all three contacts 202, 204, 206 are in the closed position.

Output device 208 can be a meter, capacitance meter, multimeter, a comparison device, or a display screen operable to output one or more capacitance measurements or otherwise compare capacitance components, measurements or data. In this example, the output device 208 can be operable to measure one or more capacitance components, such as 210, 212. Measurements of one or more capacitance components 210, 212 can be received by, obtained by, or transmitted to the output device 212, such that capacitance of an object, such as a stator component or stator bar 114, can be measured or compared. An output from the output device 212, such as a signal or other type of indication, can be observed by a user or operator, and an appropriate response or action can be performed if needed.

Capacitance component 210, designated as $C_{step}$ or $C_{paddle}$, can be associated with the actuation or closing of contacts 202, 204, 206. Capacitance component 212, designated as $C_{insulation}$ or $C_{bar}$, is shown associated with an object to be sensed, such as a stator component or stator bar, similar to 114 in FIG. 1. When the contacts 202, 204, 206 are closed and the closed electrical circuit is formed, the output device 208 can measure capacitance of an object, such as a stator bar, by comparing the capacitance component ($C_{step}$ or $C_{paddle}$) 210 and the capacitance component of the object or ($C_{insulation}$ or $C_{bar}$) 212. In this manner, a capacitance measurement of an object to be sensed can be obtained. In other embodiments, fewer or greater numbers of contacts, and other capacitance components can be used in accordance with the invention.

As discussed above, in other embodiments, the contacts can be operable to communicate with a different type of output device, such as a device which can measure a change in the impedance, complex impedance, or other physical characteristic of an object. In these embodiments, changes in the impedance, complex impedance, or other physical characteristics can be used to determine whether a change in the condition of the object being sensed has occurred or is occurring.

In one embodiment, the output device 212 can include an associated processor, hardware, or software operable to process capacitance components 210, 212. For example, a set of computer-executable instructions stored on a computer-readable medium can be adapted to provide thresholding and automatic logging capabilities for the capacitance measurements. Capacitance components or measurements may be collected automatically, particularly when the system and apparatus 100 and/or contacts 102, 104, 106, are suitably positioned, i.e., the contacts 202, 204, 206 are in a closed position creating a closed electrical loop. When the contacts 202, 204, 206 are suitably positioned, a corresponding step change in the capacitance measured by or otherwise determined by the output device 212 can be identified to confirm the positioning of the contacts 202, 204, 206. In this manner, measurement cycle times can be reduced, and relatively accurate measurements can be collected by a single user or operator without need for additional personnel.

In an aspect of an embodiment, thresholds can be defined or otherwise set to determine whether a certain capacitance measurement corresponding with the presence of moisture on the object being sensed. For example, a predefined threshold can be set for a particular capacitance measurement corresponding to whether moisture is present on an insulated stator bar for a liquid cooled generator. Various combinations of measurements and/or thresholds can be used to generate a capacitance map for an object such as a stator bar or generator.

For other embodiments, the output device can be operable to output a measurement of impedance or other physical characteristic depending on the configuration of electrical devices in series with the contacts 202, 204, 206. Processing of these alternate measurements by a processor, hardware, or software associated with the output device can include corresponding thresholding and automatic logging capabilities. In one example, a phase shift measurement technique used to measure impedance or complex impedance can be implemented by a set of computer-readable instructions.

The system 200 can be implemented with one or more stator components, such as a series of stator bars. For example, as shown in system 300 of FIG. 4, a series of stator bars 302, 304 can be monitored using a corresponding series of apparatus or paddle-type devices 306, 308, 310, 312, each similar to the apparatus 200 or paddle-type device shown in FIG. 3. Each of the paddles 306, 308, 310, 312 can be functionally connected to at least one output device 314, such as a meter, multimeter, a comparison device, or a display screen operable to output a capacitance measurement. Data collected or otherwise obtained by the output device 314 can be used to generate a capacitance map for the series of stator bars 302, 304, or other objects being sensed. Those skilled in the art will recognize the devices and techniques needed to generate a capacitance map for the stator bars 302, 304 or other objects.

In one embodiment, the system 300 can utilize one or more conductive strands or wires in lieu of apparatus or paddle-type devices 306, 308, 310, 312. The conductive strands or wires can be functionally connected to the output device 314, and capacitance measurements can be obtained in a similar manner as described above.

In one embodiment, a processor, hardware, or software associated with the output device 314 of FIG. 3 can be operable to statistically analyze the capacitance measurements to determine whether any outlier data exists or a predefined threshold is met or unmet. For example, a processor such as 316 in FIG. 3 can execute computer-executable instructions 318 stored in a computer-readable medium, such as a memory 320 in FIG. 3, to process an output associated with the output device 314. The computer-readable instructions 318 can be operable to determine or identify outlier data, to determine or identify thresholds and compare data against the thresholds, and to generate a capacitance map based at least in part on the an output associated with the output device 314. Outlier data can include, but is not limited to, data that is at least three standard deviations away from the mean. A threshold can include, but is not limited to, a predetermined point or measure, and which is assumed to be associated or otherwise correlated with the existence a predefined condition, such as the presence of moisture on the stator bar or object being sensed. For example, a threshold can be a capacitance measurement at approximately a three sigma limit.

In an alternative configuration, a pair of apparatus or paddle-type devices, such as 306 and 308, could be used to measure capacitance in a stator component, such as stator bar. For example, each apparatus or paddle-type device could be used to measure the capacitance between the pair of apparatus or paddle-type devices. Likewise, one or more conductive strands or wires can be used in lieu of the apparatus or paddle-type devices to measure capacitance. In any instance, the output device, such as 314, can be adapted to determine a capacitance measurement based at least in part on the measurements obtained from both of the apparatus or paddle-type devices, or alternatively one or more conductive strands or wires used in combination with apparatus or paddle-type devices. For example, an alternative capacitance measuring system to measure capacitance in an object can include at least one output device. In addition, the system can include a first paddle and a second paddle. Each paddle can include at least one contact, wherein the at least one contact is in communication with the output device. In addition, each paddle can include a conductive material operable to mount to an object to be sensed. Furthermore, each paddle can include a compressible material adjacent to the at least one contact and the conductive material, wherein the compressible material can be compressed to permit the at least one contact to contact the object to be sensed. Moreover, the output device can output a measure of capacitance associated with the object or portion of the object to which each paddle is mounted to.

In use, the system and apparatus 100 shown in FIGS. 1 and 2, and the systems 200, 300 respectively shown in FIGS. 3 and 4 can be used to measure capacitance in a liquid cooled generator, in particular, one or more stator components or stator bars. A method for using the system and apparatus 100 can include providing a system and apparatus 100 as described in FIGS. 1 and 2. Using a mounting device, such as 108 in FIGS. 1 and 2, associated with apparatus, the system and apparatus 100 can be mounted to an object to be sensed, such as a stator component or stator bar. As the mounting device 108 is mounted to the object to be sensed, a compressible material, such as 110 in FIGS. 1 and 2, associated with the system and apparatus 100 can be compressed, wherein contacts, such as 102, 104, 106 in FIGS. 1 and 2, associated with the system and apparatus 100 can simultaneously contact the object to be sensed. The compressible material 110 can reduce the variability of pressure of the system and apparatus 100 against the object to be sensed, such that the contacts 102, 104, 106 and conductive material 112 are suitably mounted to the object to be sensed. Furthermore, the compressible material 110 can reduce the amount of air between the apparatus 100 and the object to be sensed. Using an output device, such as 212 in FIG. 3, the output device 212 can compare a capacitance component ($C_{step}$ or $C_{paddle}$) 208 associated with the closing or actuation of the contacts 102, 104, 106, and a capacitance component ($C_{insulation}$ or $C_{bar}$) 210 associated with the object to be sensed. A user or operator can observe an output or other indication from the output device 212 and obtained with the system and apparatus 100. In one embodiment, a reduction in variability of the pressure of the system and apparatus 100 against the object to be sensed and/or reduction in the amount of air between the system and apparatus 100 and the object to be sensed can minimize the noise in the capacitance measurements, and improved capacitance measurements can be obtained. Capacitance measurements can be obtained by an output device 212, and based at least in part on the output from the output device 212, a capacitance map of the object can be generated. Using a capacitance map and/or a series of capacitance measurements, the existence of one or more failures in the object can be obtained. For example, one or more insulation failures in a stator component such as a stator bar can be determined by analyzing capacitance measurements obtained with an apparatus or from a capacitance map which includes capacitance measurements from one or more apparatus mounted to or associated with a stator component or stator bar.

Other embodiments of a method for use of an apparatus or system in accordance with embodiments of the invention can include some or all of the above elements, and different combinations of the elements described above.

Many modifications and other embodiments of the inventions set forth herein will come to mind to one skilled in the art to which these inventions pertain having the benefit of the teachings presented in the foregoing descriptions and the associated drawings. Thus, it will be appreciated by those of ordinary skill in the art that the invention may be embodied in many forms and should not be limited to the embodiments described above. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The claimed invention is:

1. A system for measuring capacitance in an object, the system comprising:
   an output device operable to measure capacitance in the object;
   at least three contacts operable to electrically contact the output device;
   at least one conductive material operable to mount to the object to be sensed;
   a compressible material adjacent to at least some of the at least three contacts and the at least one conductive material, wherein the compressible material is compressed to permit the contacts to simultaneously electrically contact the object to create a closed electrical circuit between the output device, the at least three contacts, and the object, and wherein the output device outputs a measure of capacitance associated with the object.

2. The system of claim 1, wherein the output device comprises at least one of the following: a display screen, a multimeter, or a meter.

3. The system of claim 1, wherein the contacts comprise at least one of the following: a conductive object, micro-switches, or pressure sensors.

4. The system of claim 1, wherein the at least one conductive material comprises at least one of the following: a foil, a metallic material, or a partially conductive material.

5. The system of claim 1, wherein the compressible material comprises at least one of the following: a foam, a gel, rubber, silicone rubber, silicone gel, an elastomer, a compliant material, or a spring.

6. The system of claim 1, wherein the compressible material and the at least one conductive material are integrated components.

7. The system of claim 1, wherein the object to be sensed comprises at least one of the following: an insulated stator bar, a stator bar, a stator component, a generator component, or an electrically-powered device.

8. The system of claim 1, wherein an output from the output device is used to generate a capacitance map of the object.

9. The system of claim 1, wherein the output device is adapted to measure complex impedance.

10. A method for measuring capacitance in an object, the method comprising:
    providing a capacitance measuring device comprising:
       an output device operable to output an indication associated with capacitance in the object;
       at least three contacts operable to electrically contact the output device;
       at least one conductive material operable to mount to the object to be sensed;
       a compressible material adjacent to at least some of the at least three contacts and the at least one conductive material, wherein the compressible material is compressed to permit at least some of the contacts to simultaneously electrically contact the object;
    positioning the capacitance measuring device adjacent the object;
    compressing the compressible material against the object, wherein at least some of the contacts simultaneously electrically contact the object to create a closed electrical circuit between the output device, the at least three contacts, and the object; and
    observing an output from the output device, wherein the output is associated with the capacitance of the object.

11. The method of claim 10, wherein the providing a capacitance measuring device comprises:
    providing the output device comprising at least one of the following: a display screen, a multimeter, or a meter.

12. The method of claim 10, wherein the providing a capacitance measuring device comprises:
    providing the contacts comprising at least one of the following: a conductive object, micro-switches, or pressure sensors.

13. The method of claim 10, wherein the providing a capacitance measuring device comprises:
    providing the at least one conductive material comprising at least one of the following: a foil, a metallic material, or a partially conductive material.

14. The method of claim 10, wherein the providing a capacitance measuring device comprises:
    providing the compressible material comprising at least one of the following: a foam, a gel, rubber, silicone rubber, silicone gel, an elastomer, a compliant material, or a spring.

15. The method of claim 10, wherein the providing a capacitance measuring device comprises:
providing the compressible material and the at least one conductive material as integrated components.

16. The method of claim 10, wherein the providing a capacitance measuring device comprises:
providing the object to be sensed comprising at least one of the following: an insulated stator bar, a stator bar, a stator component, a generator component, or an electrically-powered device.

17. The method of claim 10, further comprising:
generating a capacitance map of the object based at least in part on the output.

18. The method of claim 10, wherein the providing a capacitance measuring device comprises:
providing the output device further operable to output an indication associated with complex impedance of an object.

19. A system for measuring capacitance in an object, the system comprising:
at least one output device operable to measure capacitance in the object to be sensed;
a first paddle and a second paddle, each paddle comprising;
at least one contact, wherein the at least one contact is in communication with the at least one output device;
a conductive material operable to mount to the object to be sensed; and
a compressible material adjacent to the at least one contact and the conductive material, wherein the compressible material can be compressed to permit the at least one contact to electrically contact the object to create a closed electrical circuit between the at least one output device, the at least one contact of the first paddle and the at least one contact of the second paddle, and the object to be sensed, wherein the output device outputs a measure of capacitance associated with at least one capacitance component associated with each paddle.

* * * * *